US008514486B2

(12) United States Patent
Ershov et al.

(10) Patent No.: US 8,514,486 B2
(45) Date of Patent: Aug. 20, 2013

(54) DRIVE LASER FOR EUV LIGHT SOURCE

(75) Inventors: Alexander I. Ershov, Escondido, CA (US); Igor V. Fomenkov, San Diego, CA (US); Norbert R. Bowering, Bielefeld (DE); Jerzy R. Hoffman, Montebello, CA (US)

(73) Assignee: Cymer LLC, San Diego, CA (US)

( * ) Notice: Subject to any disclaimer, the term of this patent is extended or adjusted under 35 U.S.C. 154(b) by 331 days.

(21) Appl. No.: 12/927,012

(22) Filed: Nov. 3, 2010

(65) Prior Publication Data
US 2011/0058588 A1   Mar. 10, 2011

Related U.S. Application Data

(62) Division of application No. 12/004,905, filed on Dec. 20, 2007, now Pat. No. 7,916,388.

(51) Int. Cl.
*H01S 3/00* (2006.01)
(52) U.S. Cl.
USPC ......................................... 359/346; 250/493.1
(58) Field of Classification Search
USPC .................. 359/333, 346; 250/504 R, 493.1; 378/119
See application file for complete search history.

(56) References Cited

U.S. PATENT DOCUMENTS

| 5,974,060 | A | 10/1999 | Byren et al. ........... 372/19 |
| 6,002,744 | A * | 12/1999 | Hertz et al. ............ 378/119 |
| 6,197,133 | B1 * | 3/2001 | Unternahrer et al. ...... 148/525 |
| 6,549,551 | B2 | 4/2003 | Ness et al. .......... 372/38.07 |
| 6,567,450 | B2 | 5/2003 | Myers et al. ........... 372/55 |
| 6,625,191 | B2 | 9/2003 | Knowles et al. ......... 372/55 |
| 6,654,390 | B2 | 11/2003 | Spiegelberg et al. ...... 372/6 |
| 6,855,943 | B2 * | 2/2005 | Shields ............... 250/504 R |
| 7,161,163 | B2 * | 1/2007 | Gaebel et al. ......... 250/504 R |
| 7,372,056 | B2 | 5/2008 | Bykanov et al. ....... 250/504 R |
| 7,405,416 | B2 | 7/2008 | Algots et al. ........... 250/493.1 |
| 7,439,530 | B2 | 10/2008 | Ershov et al. ......... 250/504 R |
| 2006/0176925 | A1 * | 8/2006 | Nakano ................ 372/69 |
| 2006/0219957 | A1 | 10/2006 | Ershov et al. ......... 250/504 R |
| 2006/0249699 | A1 | 11/2006 | Bowering et al. ...... 250/504 R |
| 2006/0255298 | A1 | 11/2006 | Bykanov et al. ....... 250/504 R |
| 2007/0291350 | A1 | 12/2007 | Ershov et al. ............ 359/333 |
| 2008/0043321 | A1 | 2/2008 | Bowering et al. ........ 359/359 |
| 2008/0048133 | A1 | 2/2008 | Bykanov et al. ....... 250/504 R |
| 2008/0087847 | A1 | 4/2008 | Bykanov et al. ....... 250/504 R |

FOREIGN PATENT DOCUMENTS

JP   2000-246468   9/2000

OTHER PUBLICATIONS

Veisz, L., et al., "Plasma mirror with few-cycle laser pulses"; p. 422; 2005 conference on Lasers and Electro-Optics Europe. 0-7803-8974.
Haglund, Richard F., et al.; Gaseous Saturable Absorbers for the Helios $CO_2$ Laser System; IEEE Journal of Quantum Electronics, vol. QE-17, No. 9, Sep. 1981.

(Continued)

*Primary Examiner* — Mark Hellner
(74) *Attorney, Agent, or Firm* — Cymer LLC

(57) ABSTRACT

A device comprising a laser source producing a continuous output on a beam path and an amplifier is disclosed. The device further includes a partially transmissive, partially reflective optic disposed on said beam path between said laser source and said amplifier. The device further includes a droplet generator positioned to deliver a droplet moving on a path intersecting said beam path, the droplet reflecting light to establish an optical cavity with said optic.

7 Claims, 4 Drawing Sheets

(56) References Cited

OTHER PUBLICATIONS

Heppner, J., et al., "Bistability and Passive Q-Switching of a $CO_2$ Laser With Saturable Absorber"; pp. 77-82; Appl. Phys. B 35, 77-82 (1984).
U.S. Appl. No. 11/827,803, Jul. 13, 2007, Vaschenko.
Hribek, P. and Vrobova, M.; "Nd-Glass Laser With Plasma Mirror"; pp. 1331-1340; Czech. J. Phys. B35 (1985).
Kholin, V.; "Electron-Beam-Controlled $CO_2$ Laser With Plasma Mirror"; pp. 118-145; Trudy Ordena Lenina Fizicheskogo Instituta im. P.N. Lebedeval, vol. 116, pp. 118-145 (1980).
Piche, M and Belanger, P.A.; "Short Pulse Generation From Intractivity Laser Breakdown Plasmas"; Optics Communications; pp. 158-160; Optics Communications vol. 24, No. 2, Feb. (1978).
Tachikawa, M. et al.; "Undamped Undulation Superposed on the Passive Q-Switching Pulse of a $CO_2$ Laser"; pp. 83-90; Appl. Phys. B 39 (1986).
Veisz, L., et al., "Plasma mirror with few-cycle laser pulses"; p. 422; 2005 conference on Lasers and Electro-Optics Europe. 0-7813-8974.
International Search Report, Mar. 18, 2009, WOX.
English Language version of relevant portion of Japanese Office Action (Mailing Date Nov. 15, 2012) cited in counterpart Japanese Patent Application No. 2010-539428, filed May 12, 2008 as provided by Japanese counsel (2 pages).
English Abstract of Laid-Open Japanese Publication No. 2000-246468 (One page).

* cited by examiner

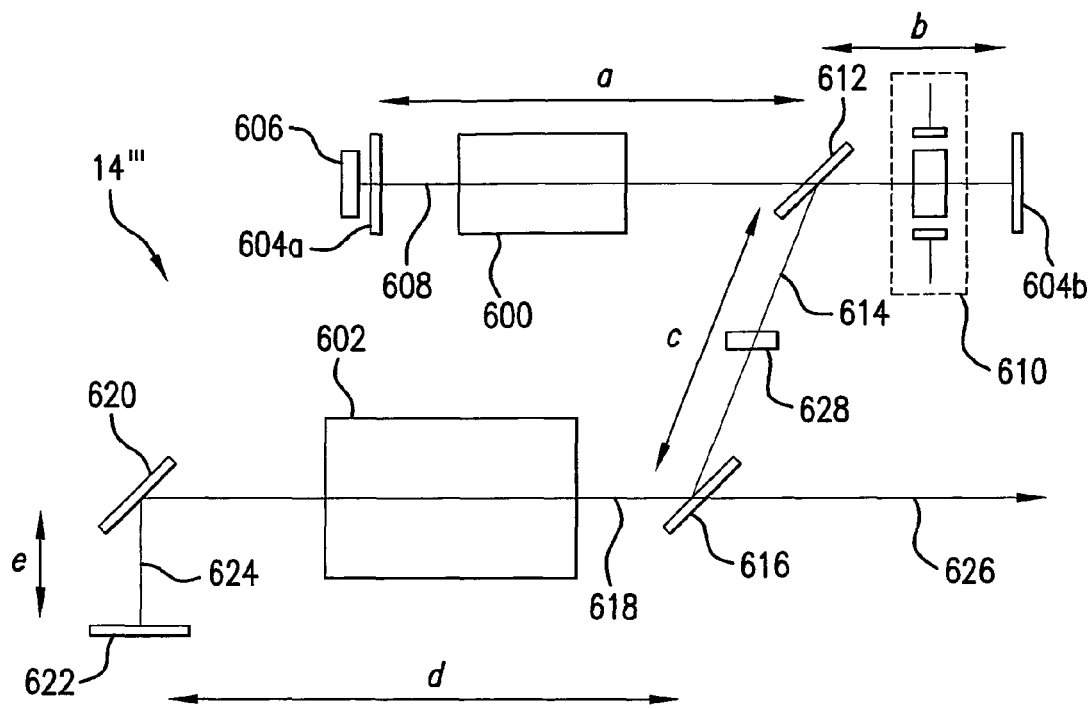
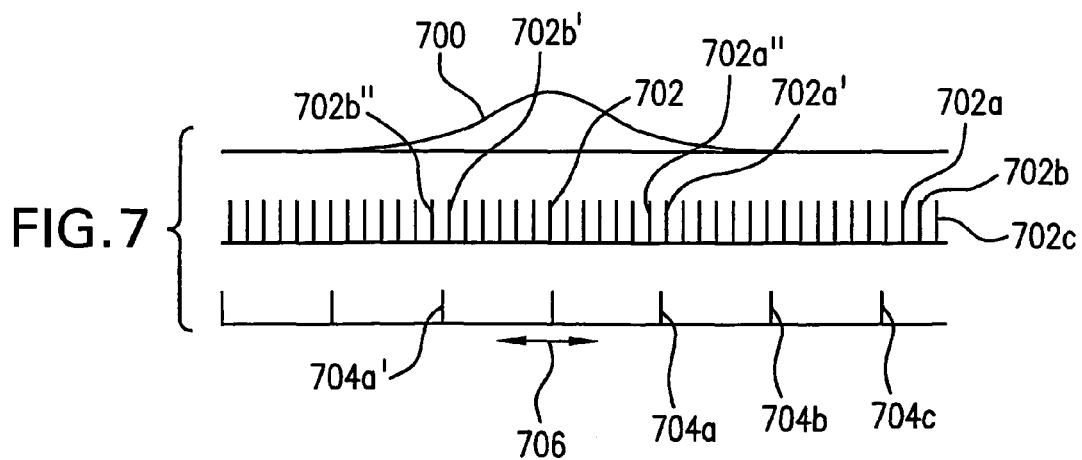
FIG.6
FIG.7

DRIVE LASER FOR EUV LIGHT SOURCE

CROSS-REFERENCE TO RELATED APPLICATIONS

The present application is a divisional of U.S. patent application Ser. No. 12/004,905, filed on Dec. 20, 2007, published on Jun. 25, 2009, as U.S. 2009/0161201A1, entitled "DRIVE LASER FOR EUV LIGHT SOURCE", the contents of which are incorporated herein by reference.

The present application is related to U.S. patent application Ser. No. 11/827,803 filed on Jul. 13, 2007, published on Jan. 15, 2009, as U.S. 2009/0014668A1, entitled LASER PRODUCED PLASMA EUV LIGHT SOURCE HAVING A DROPLET STREAM PRODUCED USING A MODULATED DISTURBANCE WAVE, U.S. patent application Ser. No. 11/358,988 filed on Feb. 21, 2006, published on Nov. 16, 2006, as U.S. 2006/0255298A1, entitled LASER PRODUCED PLASMA EUV LIGHT SOURCE WITH PREPULSE, published on Nov. 16, 2006, as U.S. 2006/0255298A1; U.S. patent application Ser. No. 11/067,124 filed on Feb. 25, 2005, now U.S. Pat. No. 7,405,416, issued on Jul. 29, 2008, entitled METHOD AND APPARATUS FOR EUV PLASMA SOURCE TARGET DELIVERY, U.S. patent application Ser. No. 11/174,443 filed on Jun. 29, 2005, now U.S. Pat. No. 7,372,056, issued on May 13, 2008, entitled LPP EUV PLASMA SOURCE MATERIAL TARGET DELIVERY SYSTEM, U.S. patent application Ser. No. 11/358,983, filed on Feb. 21, 2006, now U.S. Pat. No. 7,378,673, issued on May 27, 2008, entitled SOURCE MATERIAL DISPENSER FOR EUV LIGHT SOURCE, U.S. patent application Ser. No. 11/358,992 filed on Feb. 21, 2006, now U.S. Pat. No. 7,598,509, issued on Oct. 6, 2009, entitled LASER PRODUCED PLASMA EUV LIGHT SOURCE, U.S. patent application Ser. No. 11/174,299 filed on Jun. 29, 2005, now U.S. Pat. No. 7,439,530, issued on Oct. 21, 2008, entitled, LPP EUV LIGHT SOURCE DRIVE LASER SYSTEM, U.S. patent application Ser. No. 11/406,216 filed on Apr. 17, 2006, now U.S. Pat. No. 7,465,946, issued on Dec. 16, 2008, entitled ALTERNATIVE FUELS FOR EUV LIGHT SOURCE, U.S. patent application Ser. No. 11/580,414 filed on Oct. 13, 2006, now U.S. Pat. No. 7,491,954, issued on Feb. 17, 2009, entitled, DRIVE LASER DELIVERY SYSTEMS FOR EUV LIGHT SOURCE, U.S. patent application Ser. No. 11/644,153 filed on Dec. 22, 2006, published on Jun. 26, 2008, as U.S. 2008/0149862A1, entitled, LASER PRODUCED PLASMA EUV LIGHT SOURCE, U.S. patent application Ser. No. 11/505,177 filed on Aug. 16, 2006, published on Feb. 21, 2008, as U.S. 2008/0043321A1, entitled EUV OPTICS, U.S. patent application Ser. No. 11/452,558 filed on Jun. 14, 2006, now U.S. Pat. No. 7,518,787, issued on Apr. 14, 2009, entitled DRIVE LASER FOR EUV LIGHT SOURCE, U.S. patent application Ser. No. 10/712,545, filed on Nov. 13, 2003, now U.S. Pat. No. 6,928,093, issued to Webb, et al., on Aug. 9, 2005, entitled LONG DELAY AND HIGH TIS PULSE STRETCHER; U.S. patent application Ser. No. 11/394,512, filed on Mar. 31, 2006, now U.S. Pat. No. 7,415,056, issued on Aug. 19, 2008, entitled CONFOCAL PULSE STRETCHER, U.S. patent application Ser. No. 11/138,001, filed on May 26, 2005, published on Nov. 24, 2005, as U.S. 2005/0259709A1, entitled SYSTEMS AND METHODS FOR IMPLEMENTING AN INTERACTION BETWEEN A LASER SHAPED AS A LINE BEAM AND A FILM DEPOSITED ON A SUBSTRATE, published on Nov. 24, 2005, as US 2005/0259709A1; U.S. patent application Ser. No. 10/141,216, filed on May 7, 2002, now U.S. Pat. No. 6,693,939, issued on Feb. 17, 2004, entitled LASER LITHOGRAPHY LIGHT SOURCE WITH BEAM DELIVERY, U.S. Pat. No. 6,625,191 issued to Knowles, et al., on Sep. 23, 2003, entitled VERY NARROW BAND, TWO CHAMBER, HIGH REP RATE GAS DISCHARGE LASER SYSTEM, U.S. patent application Ser. No. 10/012,002, filed on Nov. 30, 2001, U.S. Pat. No. 6,549,551 issued to Ness, et al., on Apr. 15, 2003, entitled INJECTION SEEDED LASER WITH PRECISE TIMING CONTROL, U.S. patent application Ser. No. 09/848,043, filed on May 3, 2001, U.S. Pat. No. 6,567,450 issued to Myers, et al., on May 20, 2003, entitled VERY NARROW BAND, TWO CHAMBER, HIGH REP RATE GAS DISCHARGE LASER SYSTEM, U.S. patent application Ser. No. 09/943,343, filed on Aug. 29, 2001, and U.S. patent application Ser. No. 11/509,925 filed on Aug. 25, 2006, now U.S. Pat. No. 7,476,886, issued on Jan. 13, 2009, entitled SOURCE MATERIAL COLLECTION UNIT FOR A LASER PRODUCED PLASMA EUV LIGHT SOURCE, the entire contents of each of which are hereby incorporated by reference herein.

FIELD

The present application relates to extreme ultraviolet ("EUV") light sources providing EUV light from a plasma created from a source material and collected and directed to a focus for utilization outside of the EUV light source chamber, e.g., for semiconductor integrated circuit manufacturing photolithography e.g., at wavelengths of around 100 nm and below.

BACKGROUND

Extreme ultraviolet ("EUV") light, e.g., electromagnetic radiation having wavelengths of around 5-100 nm or less (also sometimes referred to as soft x-rays), and including light at a wavelength of about 13 nm, can be used in photolithography processes to produce extremely small features in substrates, e.g., silicon wafers.

Methods to produce EUV light include, but are not necessarily limited to, converting a material into a plasma state that has an element, e.g., xenon, lithium or tin, with an emission line in the EUV range. In one such method, often termed laser produced plasma ("LPP") the required plasma can be produced by irradiating a target material, for example in the form of a droplet, stream or cluster of material, with a laser beam.

For this process, the plasma is typically produced in a sealed vessel, e.g., vacuum chamber, and monitored using various types of metrology equipment. In addition to generating EUV radiation, these plasma processes also typically generate undesirable by-products in the plasma chamber which can include out-of-band radiation, high energy ions and debris, e.g., atoms and/or clumps/microdroplets of the target material.

These plasma formation by-products can potentially heat, damage or reduce the operational efficiency of the various plasma chamber optical elements including, but not limited to, collector mirrors including multi-layer mirrors (MLM's) capable of EUV reflection at normal incidence and/or grazing incidence, the surfaces of metrology detectors, windows used to image the plasma formation process, and the laser input window. The heat, high energy ions and/or debris may be damaging to the optical elements in a number of ways, including coating them with materials which reduce light transmission, penetrating into them and, e.g., damaging structural integrity and/or optical properties, e.g., the ability of a mirror to reflect light at such short wavelengths, corroding or eroding them and/or diffusing into them. Thus, it is typically desirable to minimize the amount of and/or the effect of plasma generated debris.

Heretofore, LPP systems have been disclosed in which each droplet is irradiated by a separate laser pulse to form a plasma from each droplet. Also, systems have been disclosed in which each droplet is sequentially illuminated by more than one light pulses. In some cases, each droplet may be exposed to a so-called "pre-pulse" and a so-called "main pulse", however, it is to be appreciated that more than one pre-pulse may be used and more than one main pulse may be used and that the functions of the pre-pulse and main pulse may overlap to some extent. Typically, the pre-pulse(s) may function to expand the material and thereby increase the amount of material which interacts with the main pulse and the main-pulse may function to convert most or all of the material into a plasma and thereby produce an EUV light emission. However, it is to be appreciated that the functions of the pre-pulse and main pulse may overlap to some extent, e.g., the pre-pulse(s) may generate some plasma, etc. The increased material/pulse interaction may be due a larger cross-section of material exposed to the pulse, a greater penetration of the pulse into the material due to the material's decreased density, or both. Another benefit of pre-pulsing is that it may expand the target to the size of the focused pulse, allowing all of the pulse to participate. This may be especially beneficial if relatively small droplets are used as targets and the irradiating light cannot be focused to the size of the small droplet. Thus, in some applications, it may be desirable to use pre-pulsing to increase conversion efficiency and/or allow use of relatively small, e.g. so-called, mass limited targets. The use of relatively small targets, in turn, may be used to lower debris generation and/or reduce source material consumption.

As indicated above, one technique to produce EUV light involves irradiating a target material. In this regard, $CO_2$ lasers, e.g., outputting light at infra-red wavelengths, e.g. 9.3 μm or 10.6 μm, may present certain advantages as a drive laser irradiating a target material in an LPP process. This may be especially true for certain target materials, e.g., materials containing tin. For example, one advantage may include the ability to produce a relatively high conversion efficiency between the drive laser input power and the output EUV power. Another advantage of $CO_2$ drive lasers may include the ability of the relatively long wavelength light (for example, as compared to deep UV at 193 nm) to reflect from relatively rough surfaces such as a reflective optic that has been coated with tin debris. This property of 10.6 μm radiation may allow reflective mirrors to be employed near the plasma for, e.g., steering, focusing and/or adjusting the focal power of the drive laser beam.

Another factor worthy of consideration is the difficulty associated with consistently and accurately hitting a series of relatively small, quickly moving droplets with a pulsed laser beam at relatively high repetition rates. For example, some high-volume EUV light sources may call for the irradiation of droplets having a diameter of about 20-50 μm and moving at a velocity of about 50-100 m/s, at repetition rates exceeding 30 kHz.

In addition to the above described techniques, U.S. Pat. No. 6,855,943 (hereinafter the '943 patent) which issued to Shields on Feb. 15, 2005 and is entitled "DROPLET TARGET DELIVERY METHOD FOR HIGH PULSE-RATE LASER-PLASMA EXTREME ULTRAVIOLET LIGHT SOURCE" discloses a technique in which only some of the droplets in a droplet stream, e.g., every third droplet, is irradiated to produce a pulsed EUV light output. As disclosed in the '943 patent, the nonparticipating droplets (so-called buffer droplets) advantageously shield the next participating droplet from the effects of the plasma generated at the irradiation site. Unfortunately, in some cases, these buffer droplets may reflect light back into the laser causing self-lasing, which among other things, can reduce the effectiveness of the laser's gain media in producing high energy pulses. This may be especially true for high gain (e.g., G=1000-10,000) infra-red lasers, e.g., $CO_2$ lasers, which tend to self-lase rather easily. Thus, it may be desirable to minimize any losses between pulses, including minimizing the effect of reflections. It may also be desirable to maximize gain extraction from a drive laser amplifier during pulse generation to produce large energy pulses, and in some cases, to provide stable consisting pulses, e.g. by minimizing instabilities, such as those caused by mode hopping in certain $CO_2$ lasers having a MO-PA configuration.

With the above in mind, Applicants disclose a drive laser for an EUV light source.

SUMMARY

In a first aspect, a device is described herein which may comprise an oscillator having an oscillator cavity length, $L_o$, and defining an oscillator path; and a multi-pass optical amplifier coupled with the oscillator to establish a combined optical cavity including the oscillator path, the combined cavity having a length, $L_{combined}$, where $L_{combined}=(N*x)*L_o$, where "N" is an integer and "x" is a number between 0.4 and 0.6.

In one embodiment described herein, the oscillator cavity may comprise an optic defining an end of the oscillator cavity and the device may comprise an electro-actuable element coupled to the optic and controllable to adjust the oscillator cavity length.

In a particular embodiment described herein, the amplifier may comprise a polarization discriminating optic, the optic inputting light traveling along a first beam path from the oscillator and having substantially a first linear polarization into the amplifier, and, the optic outputting light having substantially a linear polarization orthogonal to the first polarization out of the amplifier along a second beam path.

In one arrangement of this aspect, the oscillator may comprise an oscillator output optic, the amplifier may comprise an amplifier input optic, and the device may further comprise at least one moveable optic to adjust a beam path length between the oscillator output optic and the amplifier input optic.

In one setup, the oscillator may be configured as a cavity dumped oscillator and in another setup, the oscillator may be configured as a Q switched oscillator.

In another aspect, a device is described herein which may comprise a laser source producing a continuous output on a beam path; an amplifier; a partially transmissive, partially reflective optic disposed on the beam path between the laser source and the amplifier; and a droplet generator positioned to deliver a droplet moving on a path intersecting the beam path, the droplet reflecting light to establish an optical cavity with the optic.

For this aspect, the laser source may have a power output, the partially transmissive, partially reflective optic may have a reflectivity, and in one setup, the power output and reflectivity may be selected wherein the light entering the amplifier from the oscillator does not exceed about 2 kW. In one embodiment of this aspect described herein, the laser source may comprise a $CO_2$ laser having an output in the range of 0.1 W to 100 W. In one implementation, the partially transmissive, partially reflective optic may reflect between 75% and 99.9% of the laser source output.

In one embodiment of this aspect, an adjustable telescope may be disposed along the beam path between the oscillator and the amplifier.

In a particular embodiment of this aspect, an optical isolator may be disposed between the laser source and the partially transmissive, partially reflective optic to protect the oscillator from reflected light.

In a particular arrangement, the laser source may produce a continuous output having at least two lines and the amplifier may have a gain band including the two lines.

In another aspect, a device is described herein which may comprise a target material; at least one optic establishing a beam path with the target material; an optical gain medium positioned along the beam path; a chamber; a plurality of optics disposed in the chamber to establish a delay line along the beam path; and a saturable absorption gas disposed in the chamber to absorb at least some photons reflected from the target material.

In a particular embodiment, the optical gain medium may comprise $CO_2$ having a gain band including 10.6 μm and the saturable absorption gas may comprise $SF_6$. In another embodiment, the optical gain medium may comprises $CO_2$ having a gain band including 9.3 μm and the saturable absorption gas may be selected from the group of gases consisting of $CH_3OH$, $CH_3F$, $HCOOH$, $CD_3OD$, $CD_3F$, $DCOOD$, and combinations thereof (where the chemical symbol "D" is used to represent deuterium). For some applications, helium gas may also be disposed in the chamber.

In another aspect, a device is described herein which may comprise a first laser source producing a first output beam having a wavelength, $\lambda_1$, a second laser source producing a second output beam having a wavelength, $\lambda_2$, with, $\lambda_1 \neq \lambda_2$, and an amplifier having a gain band including $\lambda_1$ and $\lambda_2$. The device may further comprise an optical isolator having a polarization discriminating optic substantially transmitting light having a first linear polarization and substantially blocking transmission of light having a linear polarization orthogonal to the first polarization; and a coupling optic having a transmission-reflection ratio, $TRR_1$, for light having a wavelength, $\lambda_1$, and a transmission-reflection ratio, $TRR_2$, for light having a wavelength, $\lambda_2$, with $TRR_1 > TRR_2$, the optic coupling the first output beam and second output beam onto a common beam path through the amplifier.

In one embodiment of this aspect, the first laser source may have a gain medium comprising $CO_2$ producing a first output beam having a wavelength, $\lambda_1$ of 10.6 μm and the second laser source may have a gain medium comprising $CO_2$ producing a second output beam having a wavelength, $\lambda_2$, of 9.3 μm.

In one setup, the optical isolator may comprise a forty-five degree phase retarding optic and a linear polarization filter.

In a particular arrangement, the amplifier may comprise a plurality of amplifier chambers positioned along a common beam path and the coupling optic may be positioned between two amplifier chambers on the common beam path.

BRIEF DESCRIPTION OF THE DRAWINGS

FIG. 6 shows an embodiment of device for use in the EUV light source shown in FIG. 3 having a multi-pass power amplifier;

FIG. 7 shows the frequency v. amplitude relationship for oscillator gain bandwidth (top), PA modes (middle) and oscillator modes (bottom);

DETAILED DESCRIPTION

Figure 1:
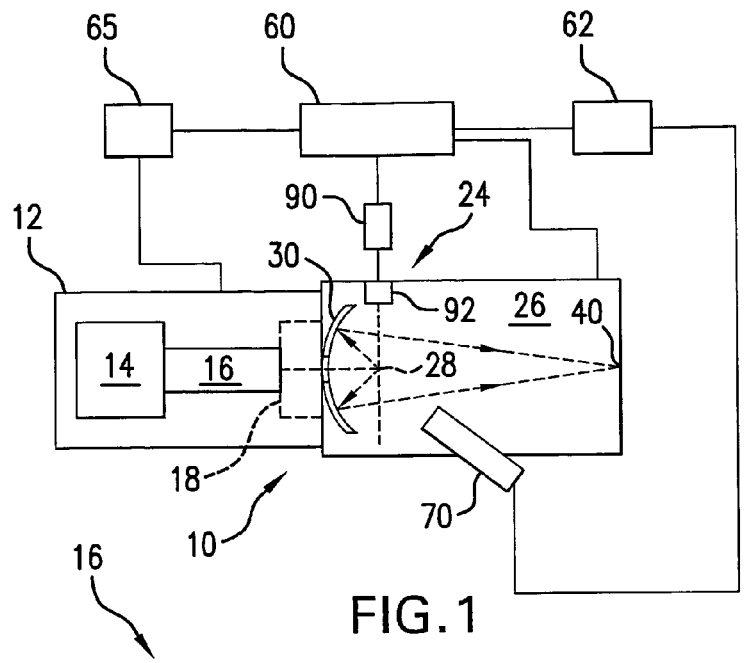
FIG. 1 shows a simplified schematic view of a laser-produced plasma EUV light source according to an aspect of the present disclosure.

With initial reference to FIG. 1 there is shown a schematic view of an EUV light source, e.g., a laser-produced-plasma, EUV light source 10 according to one aspect of an embodiment. As shown in FIG. 1, and described in further details below, the LPP light source 10 may include a system 12 for generating and delivering a train of light pulses. As shown, the system 12 may include a device 14 generating pulses (which in some cases may include one or more main pulses and one or more pre-pulses), an isolator 16 (described in more detail below with reference to FIG. 2) for isolating the device 14 from at least some downstream reflections, and an optional beam delivery system 18 (shown with dashed lines to indicate an optional component) for pulse shaping, focusing, steering and/or adjusting the focal power of the pulses exiting the isolator 16, and delivering the light pulses to a target location in chamber 26. For the EUV light source 10, each light pulse may travel along a beam path from the system 12 and into the chamber 26 to illuminate a respective target droplet at an irradiation region, e.g. at or near a focus 28 of an ellipsoidal mirror 30.

Device 14 may include one or more lasers and/or lamps for providing one or more main pulses and, in some cases, one or more pre-pulses. Suitable lasers for use in the device 14 shown in FIG. 1 may include a pulsed laser device, e.g., a pulsed, gas-discharge $CO_2$ laser device producing radiation at 9.3 μm or 10.6 μm, e.g., with DC or RF excitation, operating at relatively high power, e.g., 10 kW or higher and high pulse repetition rate, e.g., 50 kHz or more. In one particular implementation, the laser may be an RF-pumped $CO_2$ laser having a MOPA configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, steered and/or focused before entering the LPP chamber. Continuously RF pumped, fast axial flow, $CO_2$ amplifiers may be used for the system 12. For example, a suitable $CO_2$ laser device having an oscillator and three amplifiers (O-PA1-PA2-PA3 configuration) is disclosed in U.S. patent application Ser. No. 11/174,299 filed on Jun. 29, 2005, now U.S. Pat. No. 7,439,530, issued on Oct. 21, 2008, entitled, LPP EUV LIGHT SOURCE DRIVE LASER SYSTEM, the entire contents of which have been previously incorporated by reference herein. Alternatively, the laser may be configured as a so-called "self-targeting" laser system in which the droplet serves as one mirror of the optical cavity. In some "self-targeting" arrangements, a master oscillator may not be required. Self targeting laser systems are disclosed and claimed in U.S. patent application Ser. No. 11/580,414 filed on Oct. 13, 2006, now U.S. Pat. No. 7,491,954, issued on Feb. 17, 2009, entitled, DRIVE LASER DELIVERY SYSTEMS FOR EUV LIGHT SOURCE, the entire contents of which have been previously incorporated by reference herein. Alternatively, one of the laser architectures described below and shown in FIG. 4, 5, 6 or 9 may be used for the EUV light source 10 shown in FIG. 1.

Depending on the application, other types of lasers may also be suitable, e.g., an excimer or molecular fluorine laser operating at high power and high pulse repetition rate. Examples include, a solid state laser, e.g., having a fiber or disk shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

A suitable beam delivery system 18 for pulse shaping, focusing, steering and/or adjusting the focal power of the pulses is disclosed in U.S. patent application Ser. No. 11/358,992 filed on Feb. 21, 2006, now U.S. Pat. No. 7,598,509, issued on Oct. 6, 2009, entitled LASER PRODUCED PLASMA EUV LIGHT SOURCE, the contents of which are hereby incorporated by reference herein. As disclosed therein, one or more beam delivery system optics may be in fluid communication with the chamber 26. Pulse shaping may include adjusting pulse duration, using, for example a pulse stretcher and/or pulse trimming.

As further shown in FIG. 1, the EUV light source 10 may also include a target material delivery system 24, e.g., delivering droplets of a target material into the interior of a chamber 26 to the irradiation region where the droplets will interact with one or more light pulses, e.g., zero, one or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region at various temperatures including room temperature or near room temperature (e.g., tin alloys, $SnBr_4$) at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV source is provided in U.S. patent application Ser. No. 11/406,216 filed on Apr. 17, 2006, now U.S. Pat. No. 7,465,946, issued on Dec. 16, 2008, entitled ALTERNATIVE FUELS FOR EUV LIGHT SOURCE, the contents of which have been previously incorporated by reference herein.

Continuing with FIG. 1, the EUV light source 10 may also include an optic 30, e.g., a collector mirror in the form of a truncated ellipsoid having, e.g., a graded multi-layer coating with alternating layers of Molybdenum and Silicon. FIG. 1 shows that the optic 30 may be formed with an aperture to allow the light pulses generated by the system 12 to pass through and reach the irradiation region. As shown, the optic 30 may be, e.g., an ellipsoidal mirror that has a first focus within or near the irradiation region and a second focus at a so-called intermediate region 40 where the EUV light may be output from the EUV light source 10 and input to a device utilizing EUV light, e.g., an integrated circuit lithography tool (not shown). It is to be appreciated that other optics may be used in place of the ellipsoidal mirror for collecting and directing light to an intermediate location for subsequent delivery to a device utilizing EUV light, for example the optic may be parabolic or may be configured to deliver a beam having a ring-shaped cross-section to an intermediate location, see e.g., U.S. patent application Ser. No. 11/505,177 filed on Aug. 16, 2006, and published on Feb. 21, 2008, as US 2008/0043321A1, entitled EUV OPTICS, the contents of which are hereby incorporated by reference.

Continuing with reference to FIG. 1, the EUV light source 10 may also include an EUV controller 60, which may also include a firing control system 65 for triggering one or more lamps and/or laser devices in the system 12 to thereby generate light pulses for delivery into the chamber 26. The EUV light source 10 may also include a droplet position detection system which may include one or more droplet imagers 70 that provide an output indicative of the position of one or more droplets, e.g., relative to the irradiation region. The imager(s) 70 may provide this output to a droplet position detection feedback system 62, which can, e.g., compute a droplet position and trajectory, from which a droplet error can be computed, e.g., on a droplet by droplet basis or on average. The droplet error may then be provided as an input to the controller 60, which can, for example, provide a position, direction and/or timing correction signal to the system 12 to control a source timing circuit and/or to control a beam position and shaping system, e.g., to change the location and/or focal power of the light pulses being delivered to the irradiation region in the chamber 26.

The EUV light source 10 may include one or more EUV metrology instruments for measuring various properties of the EUV light generated by the source 10. These properties may include, for example, intensity (e.g., total intensity or intensity within a particular spectral band), spectral bandwidth, polarization, beam position, pointing, etc. For the EUV light source 10, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 10.

As further shown in FIG. 1, the EUV light source 10 may include a droplet control system 90, operable in response to a signal (which in some implementations may include the droplet error described above, or some quantity derived therefrom) from the controller 60, to e.g., modify the release point of the target material from a droplet source 92 and/or modify droplet formation timing, to correct for errors in the droplets arriving at the desired irradiation region and/or synchronize the generation of droplets with the pulsed laser system 12.

More details regarding various droplet dispenser configurations and their relative advantages may be found in U.S. patent application Ser. No. 11/827,803 filed on Jul. 13, 2007, and published on Jan. 15, 2009, as US 2009/0014668A1, entitled LASER PRODUCED PLASMA EUV LIGHT SOURCE HAVING A DROPLET STREAM PRODUCED USING A MODULATED DISTURBANCE WAVE, U.S.

patent application Ser. No. 11/358,988 filed on Feb. 21, 2006, and published on Nov. 16, 2006, as US 2006/0255298A1, entitled LASER PRODUCED PLASMA EUV LIGHT SOURCE WITH PRE-PULSE, U.S. patent application Ser. No. 11/067,124 filed on Feb. 25, 2005, now U.S. Pat. No. 7,405,416, issued on Jun. 29, 2008, entitled METHOD AND APPARATUS FOR EUV PLASMA SOURCE TARGET DELIVERY, and U.S. patent application Ser. No. 11/174,443 filed on Jun. 29, 2005, now U.S. Pat. No. 7,372,056, issued on May 13, 2008, entitled LPP EUV PLASMA SOURCE MATERIAL TARGET DELIVERY SYSTEM, the contents of each of which are hereby incorporated by reference.

Figure 2:
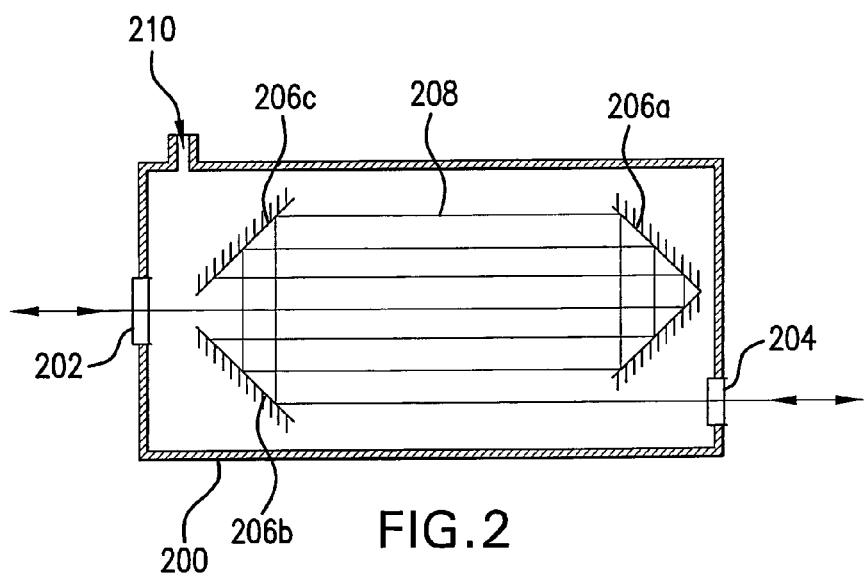
FIG. 2 shows a section view of an isolator for use in the light source shown in FIG. 1.

FIG. 2 shows an embodiment of an isolator 16 for protecting the gain media in the device 14 (shown in FIG. 1) from at least some reflected photons and/or for delaying reflected photons to prevent these photons from reaching the gain media at a time when the photons may deplete a large gain built up in the media. As shown in FIG. 2, the isolator 14 may include a chamber 200 having a first window 202 and second window 204, sealing the chamber 200, both of which may be oriented at Brewster's angle and/or coated with an anti-reflective coating. As further shown, optics 206a,b,c, which for the embodiment shown are mirrors, may be disposed in the chamber 200 to establish a seven pass, delaying beam path 208. Although three optics 206a,b,c are shown, it is to be appreciated that more than three and as few as two optics may be used to establish the delay path. Similarly, although a seven pass path is shown, it is to be appreciated that this is merely by way of illustration and that other delay path architectures may be employed within the scope of the present disclosure. It is also to be appreciated that optics other than mirrors may be used, to include components which reflect and/or transmit and/or operate on incident light and includes, but is not limited to, lenses, wedges, prisms, grisms, gradings, and mirrors including multi-layer mirrors, near-normal incidence mirrors, grazing incidence mirrors.

Continuing with FIG. 2, it can be seen that the chamber may be formed with at least one inlet 210 to allow gas to be disposed in the chamber. For example, the gas may include a saturable absorption gas which functions to absorb photons below a characteristic intensity level while allowing photons to pass above the characteristic intensity level. For example, for a device 14 (shown in FIG. 1) having a $CO_2$ optical gain medium having a gain band including 10.6 μm, the saturable absorption gas may comprise $SF_6$. On the other hand, for a device 14 having a $CO_2$ optical gain medium having a gain band including 9.3, the saturable absorption gas may be selected from the group of gases consisting of $CH_3OH$, $CH_3F$, $HCOOH$, $CD_3OD$, $CD_3F$, $DCOOD$, and combinations thereof (where the chemical symbol "D" is used to represent deuterium). For either application (i.e. 9.3 or 10.6 μm), helium gas may also be disposed in the chamber 200, e.g. at a ratio of about 1 part helium to 5 parts saturable absorption gas to improve absorption by re-population of the absorping state via collisions with helium atoms.

An optional gas outlet (not shown) may be provided to exhaust gas from the chamber 200 and to cooperate with the inlet 210 to; refresh the active gas, adjust gas composition, provide a flow of gas through the chamber to maintain optic temperature, and/or remove spent gas/contaminants.

For the arrangement shown in FIG. 2, the efficiency of the saturable absorption gas is generally proportional to the gas concentration and the length of the optical path through the gas. With this cooperation of structure, a relatively compact isolator may be provided which functions to delay reflect photons such that they do not reach an active gain media at a undesirable time (e.g. when they may extract gain between pulses) and/or the isolator may function to absorb photons below a threshold intensity level at relatively low gas concentrations (compared to the concentration required if the path was not relatively long).

Figure 3:
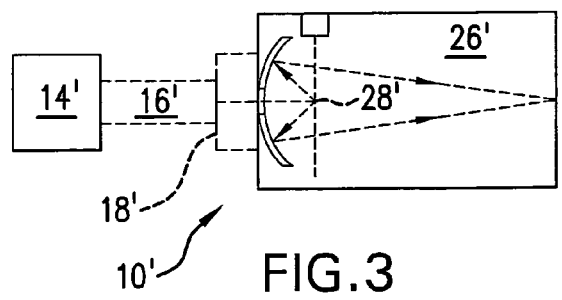
FIG. 3 shows selected portions of another embodiment of a laser-produced-plasma EUV light source.

FIG. 3 shows selected portions of another embodiment of an EUV light source 10' e.g., a laser-produced-plasma EUV light source according to one aspect of an embodiment. As shown in FIG. 3, and described in further details below, the LPP light source 10' may include a system for generating and delivering a train of light pulses to a location 28' in a chamber 26' for interaction with a target material to generate an EUV output. Also shown, the system may include a device 14' generating pulses (which in some cases may include one or more main pulses and one or more pre-pulses), an optional isolator 16' as described above with reference to FIG. 2 (shown with dashed lines to indicate an optional component) and an optional beam delivery system 18' (shown with dashed lines to indicate an optional component) for pulse shaping, focusing, steering and/or adjusting the focal power of the pulses exiting the isolator 16, and delivering the light pulses to a target location in chamber 26.

Figure 4:
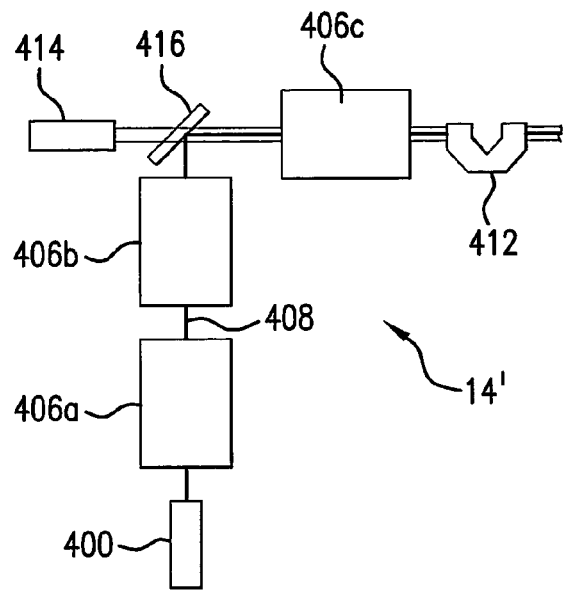
FIG. 4 shows an embodiment of a device for use in the EUV light source in which pre-pulses and main pulses are passed through a common amplifier.

FIG. 4 shows an embodiment of a device 14' for use in the EUV light source 10' shown in FIG. 3. FIG. 4 shows the device 14' may include an oscillator 400 seeding an amplifier having a chain of amplifier chambers 406a-c, arranged in series along a beam path 408, each chamber having its own active media and excitation source, e.g. pumping electrodes. For the is device 14', the oscillator 400/amplifier 406a-c combination may be used to produce a train of "main" pulses at a wavelength, $\lambda_1$, such as 10.6 μm. For example, the oscillator 400 may be a cavity-dumped or a Q-switched, pulsed, $CO_2$, Master Oscillator (MO) with relatively low energy and high repetition rate, e.g., capable of 100 kHz operation. For the device 14', the multi-chamber optical amplifier 406a,b,c may have a gain media capable of optically amplifying wavelengths within the range 9.3-10.6 μm, e.g., a high gain (G≧1,000 and in some cases 10,000) CW pumped, $CO_2$ laser amplifier. Although three amplifier chambers 406a-c are shown, it is to be appreciated that more than three and as few as one amplifier chambers may be used in the embodiment shown in FIG. 4.

Continuing with FIG. 4, polarizer(s) and/or Brewster's windows may be employed in the oscillator 400 and/or amplifier 406a-b such that light exiting the amplifier chamber 406c has a primary polarization direction. FIG. 4 also shows that the EUV light source may include an optical isolator 412 which may be positioned along a beam path 408 extending through the amplifier chamber 406a,b,c and interposed between the amplifier chamber 406c and an irradiation site where a droplet (not shown in FIG. 4) will intersect with the beam path 408. The isolator 412 may include, for example, a phase retarder mirror which, when reflecting light, converts linear polarized light to circularly polarized light, and converts circularly polarized light to linear polarized light. Thus, light initially having a primary polarization direction that is subsequently reflected twice from the phase retarder mirror is rotated ninety degrees from the primary polarization direction, i.e. the twice reflected light becomes linearly polarized in a direction orthogonal to the primary polarization direction. In addition to the phase retarder mirror, the isolator 412 may also include an linear polarization filter, e.g. isolator mirror which absorbs light that is linearly polarized in a direction orthogonal to the primary polarization direction. With this arrangement, light reflected on the beam path 408 from the target material, e.g. droplet, is absorbed by the optical isolator 412 and cannot re-enter the amplifier 406a,b,c. For example, a suitable unit for use with $CO_2$ lasers may be obtained from Kugler GmbH, Heiligenberger Str. 100, 88682, Salem, Germany under the trade name Queller and/or "isolator box". Typically, the optical isolator 412 functions to allow light to flow from the amplifier device 14' to the droplet virtually unimpeded while allowing only about one percent of back-reflected light to leak through the optical isolator 412 and reach the amplifier 406a,b,c.

FIG. 4 further shows that the device 14' may include a pre-pulse seed laser 414 which seeds at least one of the amplifier chambers 406a,b,c. For the device 14', the seed laser 414/amplifier chamber 406c combination may be used to produce a train of pre-pulses at a wavelength, $\lambda_2$, such as 9.3 µm. For example, the pre-pulse seed laser 414 may be a cavity-dumped or a Q-switched, $CO_2$, Master Oscillator (MO) with relatively low energy and high repetition rate, e.g., capable of 100 kHz operation.

As further shown in FIG. 4, coupling optic 416 is provided to co-axially couple light from amplifier chamber 406b with light from pre-pulse seed laser 414 onto a common beam path to travel through amplifier chamber 406c. For example, a coupling optic 416 having a relatively high transmission-reflection ratio, $TRR_1$, for light having a wavelength, 9.3 µm, and a relatively low transmission-reflection ratio, $TRR_2$, for light having a wavelength, 10.6 µm, may be used. For example, the beams may be combined on thin film polarizer element optimized for reflection of 10.6 um and AR coated for 9.3 um on one side, with both beams having S-polarization. For example, II-VI Corporation (headquartered in Saxonburg, Pa.) fabricates such an element for 45 degree angle of incidence (AOI) with 99.5% reflection for 10.6 um and 92% transmission for 9.3 um. Although the coupling optic 416 is shown positioned along beam path 408 between amplifier chamber 406b and amplifier chamber 406c, it is to be appreciated that it may be positioned at other locations along beam path 408 such as between amplifier chamber 406a and amplifier chamber 406b, between oscillator 400 and amplifier chamber 406a, between amplifier chamber 406c and optical isolator 412, etc.

In another implementation, the seed laser 414 may be used to produce a train of pre-pulses at a wavelength of 10.6 µm and the oscillator 400 may be used to produce a train of "main" pulses at a wavelength of 9.3 µm. For this implementation, the coupling optic 416 may be a beam coupler designed as transmissive for 10.6 um and reflective for 9.3 um. For example, II-VI Corporation (headquartered in Saxonburg, Pa.) sells an optic characterized as having 94% transmission for 10.6 um and 94% reflection for 9.3 um.

For the embodiment shown in FIG. 4, the initial irradiation of the target material by the seed laser 414 may be sufficient to expand the target material and/or vaporize the target material and/or create a partial plasma of the target material, e.g., a pre-pulse. Depending on the specific application, utilization of a pre-pulse (on the order of few milli-Joules) followed by one or more main pulses may result in improved conversion efficiency and/or a reduction in the amount of debris generated and/or for puffing up the droplet target, relaxing requirements for main beam pulse and droplet position stability and/or may allow the use of small diameter droplets. Typically, sharing output amplifier(s) of the main pulse (one or two) for amplification the pre-pulse beam may result in negligible inversion losses for the main pulse (on the order of 1%).

Figure 5:
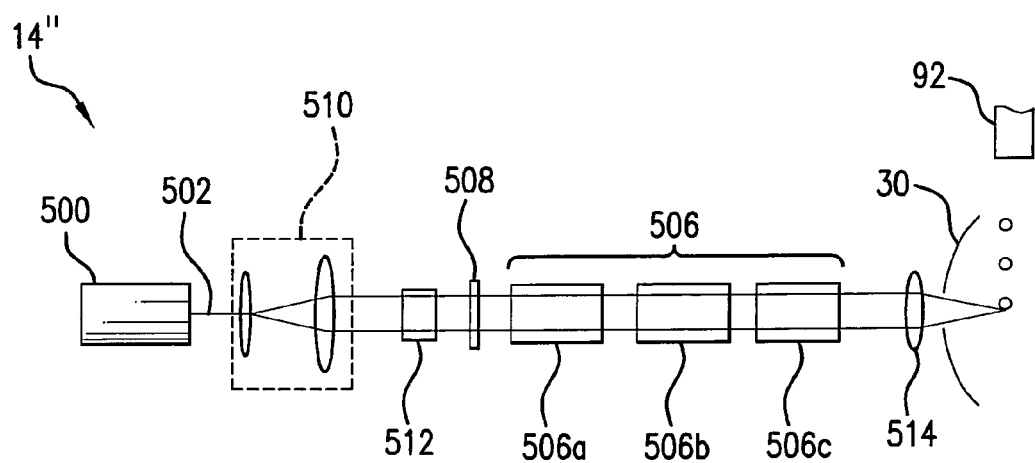
FIG. 5 shows an embodiment of an EUV light source in which a partially reflective—partially transmissive optic is disposed between q laser source producing a continuous output and an amplifier chain.

FIG. 5 shows an embodiment of another device (labeled 14"). FIG. 5 shows the device 14" may include a laser source 500 producing a continuous output on a beam path 502 and an amplifier having a chain of amplifier chambers 506a-c, arranged in series along the beam path 502, each chamber having its own active media and excitation source, e.g. pumping electrodes. For example, the laser source 500 may include a $CO_2$ laser having an output in the range of 0.1 W to 100 W and may operate on one or more rotational lines in the 9.3-10.6 micron wavelength band. For example, the laser source may run on a plurality of non-neighboring lines such as P(26), P(22), and P(18). For the device 14", the amplifier 506 may include two or more amplifier chambers, e.g. RF, continuously pumped, fast axial flow, $CO_2$ amplifier chambers (as described above), having a gain media adapted to amplify the line(s) produced by the laser source 500, and having a one pass gain of, for example 1000-10,000.

It can further be seen in FIG. 5 that a partially transmissive, partially reflective optic 508 may be disposed on the beam path 502 between the laser source 500 and the amplifier 506. For example, the optic 508 may reflect between about 75% and about 99.9% of the laser source output. In one setup, the laser source 500 power and optic 508 reflectivity are selected such that light entering the amplifier 506 from the oscillator does not significantly deplete the gain in the amplifier 506, e.g. does not exceed about 1-2 kW.

FIG. 5 further shows that the device 14" may include a droplet generator 92 positioned to deliver a series of droplets moving on a path which intersects the beam path 502. During this intersection, a droplet from the droplet generator may reflect light along the beam path 502, cooperating with the optic 508 to establish an optical cavity passing through the amplifier chamber 506a-c. With this arrangement, the optic 508, amplifier 506 and droplet combined to form a so-called "self-targeting" laser system in which the droplet serves as one mirror (a so-called plasma mirror or mechanical q-switch) of the optical cavity. Self targeting laser systems are disclosed and claimed in U.S. patent application Ser. No. 11/580,414 filed on Oct. 13, 2006, now U.S. Pat. No. 7,491, 954, issued on Feb. 17, 2009, entitled, DRIVE LASER DELIVERY SYSTEMS FOR EUV LIGHT SOURCE, the entire contents of which have been previously incorporated by reference herein.

An optional beam expanding telescope 510 may be provided, the telescope adapted to match the beam size and divergence to the io parameters required for the propagation through the amplifier 506 with minimal losses. Also, an optional opto-isolator 512 may be used to protect the laser source 500 from the reflected light.

In use light from the laser source 500 enters the main cavity of the self-directed "plasma mirror" laser system through the reflective optic 508 and fills the main cavity with photons corresponding to the rotational line(s) generated by the laser source 500. When a droplet passes through the focal area of focusing lens 514, it creates the back reflection and starts the high-intensity pulse of the self-directed, "plasma mirror" laser system. Since the cavity is already filled with the photons of the correct wavelength, a multi-line pulse may be generated that efficiently extracts gain.

FIG. 6 shows an embodiment of another device (labeled 14"') for use in the EUV light source 10' shown in FIG. 3. FIG. 6 shows the device 14"' may include a laser oscillator 600 and a multi-pass amplifier 602. For example, the oscillator 600 may be an RF, continuously pumped $CO_2$ laser having an output in the 9.3-10.6 micron wavelength band, and the amplifier 602 may be an RF, continuously pumped, fast axial flow, $CO_2$ laser having one or more amplifier chambers arranged in series and having a gain media adapted to amplify light having the wavelength output by the oscillator 600.

As further shown, the oscillator 600 may include fully reflective mirrors 604a,b with mirror 604a being operatively coupled to an electro-actuatable element 606, e.g. piezoelectric material and an electro-actuator, which can be used to move mirror 604a along the oscillator path 608 and thereby selectively adjust the oscillator cavity length, $L_o$, (shown as distance (a+b) in FIG. 6 between mirror 604a and mirror 604b).

As used herein, the term "electro-actuatable element" and its derivatives, means a material or structure which undergoes a dimensional change when subjected to a voltage, electric field, magnetic field, or combinations thereof and includes but is not limited to piezoelectric materials, electrostrictive materials and magnetostrictive materials.

Continuing with FIG. 6, polarizer(s) and/or Brewster's windows and/or prisms, etc may be employed in the oscillator 600 such that light oscillating between the mirrors 604a,b has a primary polarization direction. Device 14''' may also include a cavity dumping switch having, for example, electro-optic switch 610, e.g. Pockel's or Kerr cell, and a polarizer 612, e.g. thin-film polarizer having a transmission axis aligned parallel to the primary polarization direction defined by the oscillator 600. As shown, the polarizer 612 may be distanced from the mirror 604a by a distance "a" and be distanced from the mirror 604b by a distance "b". Thus, when the switch is de-energized, light is able to pass back and forth between the mirrors 604a,b, and, when the switch is energized, light in the oscillator cavity is rotated and is reflected by the polarizer 612 onto path 614. For example, the light may be rotated ninety degrees by the electro-optic switch 610, and thus, light exiting the oscillator 600 onto path 614 may be polarized in a direction orthogonal to the primary polarization direction defined by the transmission of polarizer 612.

From the polarizer 612, reflected light travels through a distance, "c" to another polarizer 616, e.g. e.g. thin-film polarizer having a transmission axis aligned parallel to the primary polarization direction defined by the oscillator 600. With this arrangement, light from polarizer 612 being polarized in a direction orthogonal to the primary polarization direction defined by the oscillator 600 is reflected by the polarizer 616 onto path 618 which extends through the amplifier chamber(s) 602, as shown.

The arrangement shown in FIG. 6 may further include a phase retarding mirror (PRM) 620 position along path 618 and distanced from the polarizer 616 by a distance "d", the PRM 620 converting the linear polarized light from polarizer 616 into circularly polarized light and directing the circularly polarized light to fully reflective mirror 622 along path 624. As shown, fully reflective mirror 622 is positioned at a distance "e" from PRM 620 and oriented to reflecting light incident along path 624 back onto path 624 where the light will once again be reflected by PRM 620 resulting in a second phase retardation. With these two phase retardations, light traveling from PRM 620 toward polarizer 616 will be rotated ninety degrees (relative to light traveling from polarizer 616 toward PRM 620) and thus will be polarized parallel to the primary polarization direction defined by the oscillator 600. With this polarization state, most of the light (except for a small amount of leakage) traveling from PRM 620 toward polarizer 616 will be transmitted by polarizer 616 and exit the device 14''' along path 626. An optional switch 628, which may be, for example, a mechanical chopper or acousto-optic modulator, may be positioned along path 614 to selectively limit transmission of light along path 614, as shown. Light along path 626 can be further amplified by additional amplifier chambers (not shown).

As implied above, leakage of PRM 620 and the polarizers will allow a small amount of light (polarized orthogonal to the primary polarization direction defined by the polarizer 612) to leak from amplifier 602 back into the oscillator cavity along path 614. Thus, with the switch 610 energized, this light will be able to oscillate back and forth between mirror 604a and 622. As a result, the arrangement shown in FIG. 6 will establish two optical cavities; a first optical cavity between mirror 604a and 604b having length, $L_o$ equal to (a+b), and a second optical cavity between mirror 604a and mirror 622 having length, $L_{combined} = (a+2b+c+d+e)$.

In the following discussion, an oscillator 600 will be referred to as MO, while an amplifier chamber will be referred to as PA.

In one operational mode, mirror 604a may be moved via electro-actuable element 606 such that $L_{combined} = (N+x)*L_o$, where "N" is an integer and "x" is about 0.5, e.g. a number between 0.4 and 0.6. For example, for a typical system, the lengths may be as follows: a=176 cm, b=10 cm, c=260 cm, d=746 cm and e=7 cm. Therefore, $L_{combined} = a+2b+c+d+e = 176+2*10+260+746+7 = 1209$ cm and $L_o = a+b = 186$ cm. For this case, N=6 and x=0.5. FIG. 7 illustrates the gain bandwidth 700 of the oscillator, the PA modes (of which modes 702a,b,c have been labeled), and the oscillator modes (of which modes 704a,b,c have been labeled). Note, arrow 706 in FIG. 7 illustrates that the frequency of the oscillator modes may be adjusted using the electro-actuable element 606 shown in FIG. 6.

For the dimensions recited above, the gain bandwidth of the oscillators single rotational line is about 150 MHz FWHM. For a typical oscillator cavity length $L_O$=186 cm, this corresponds to 80 MHz longitudinal mode separation. Thus, there could be a maximum of three MO modes that are within the gain band of oscillator 600. As seen in FIG. 7, only one of these three modes (mode 706) can be made at the same frequency as one of the PA modes (mode 702). The neighboring MO modes (i.e. modes 704a and 704a' in FIG. 7) will fall in between corresponding PA modes (702a' and 702a'' for MO mode 704a and 702b' and 702b'' for MO mode 704a') because of condition $L_{combined} = (N+x)*L_o$. As a result, only mode 706 can be seeded in the PA.

Figure 8:
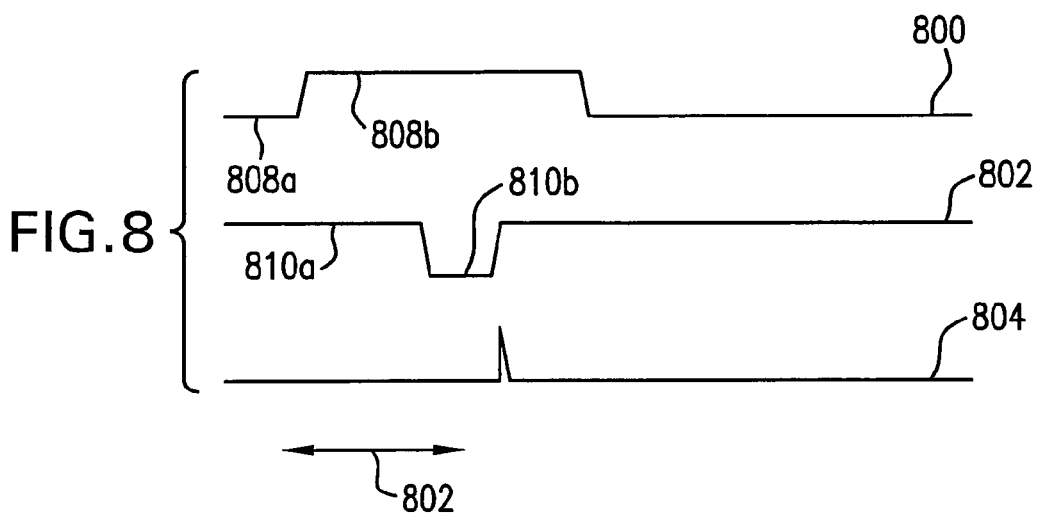
FIG. 8 illustrates a temporal sequence for the switches 610, 628 of the embodiment shown in FIG. 3.

FIG. 8 illustrates a temporal sequence showing the operation of the switch 628 (curve 800), switch 610 (curve 802), the $CO_2$ output pulse (curve 804) and the corresponding period in which the PA seeds (arrow 806). As seen there, curve 800 shows that switch 628 is initially switched from a non-transmit state 808a to a transmit state 808b. With switch 628 in transmit state 808b, curve 802 shows that switch 610 is switched from a de-energized state 810a to an energized state 810b, rotating light in oscillator cavity and sending light to the PA resulting in a $CO_2$ output pulse (curve 804).

Figure 9:
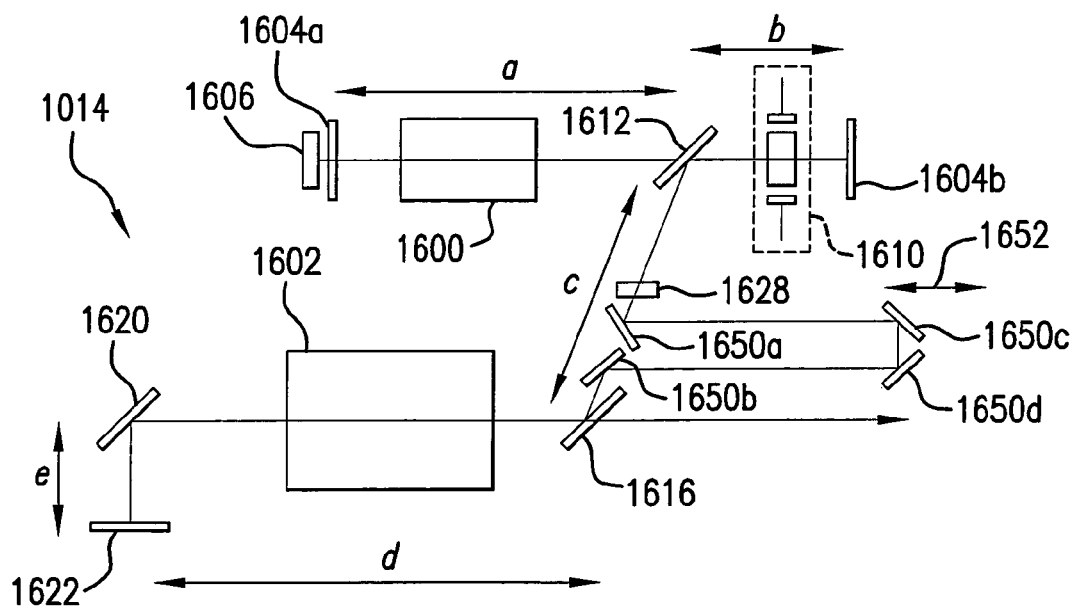
FIG. 9 shows another embodiment of a device for use in the EUV light source 10' shown in FIG. 3 in which the length of the optical path length between oscillator and amplifier is adjustable.

FIG. 9 shows another embodiment of a device (labeled 1014) for use in the EUV light source 10' shown in FIG. 3 and having one or more components in common with the arrangement shown in FIG. 6, and in which the length of the optical distance "c" is adjustable. Specifically, FIG. 9 shows the device 1014 may include a laser oscillator 1600 having fully reflective mirrors 1604a,b, electro-actuatable element 1606, amplifier 1602, polarizers 1612, 1616, PRM 1620, mirror 1622 and switches 1610, 1628 as described above, and arranged as shown. Also shown, four turning mirrors 1650a-d may be provided along the optical path length between polarizer 1612 and polarizer 1616, with mirrors 1650c and 1650d moveable in the direction of arrow 1652 to allow an adjustment of optical length c. With this arrangement, the mirror 1604a may be moved via electro-actuable element 1606 and/or the mirrors 1650c,d may be moved such that $L_{combined} = (N+x)*L_o$, where "N" is an integer and "x" is about 0.5, e.g. a number between 0.4 and 0.6, $L_{combined} = (a+2b+c+d+e)$ and $L_o = (a+b)$.

While the particular embodiment(s) described and illustrated in this patent application in the detail required to satisfy. 35 U.S.C. §112 are fully capable of attaining one or more of the above-described purposes for, problems to be solved by, or any other reasons for or objects of the embodiment(s) above described, it is to be understood by those skilled in the art that the above-described embodiment(s) are merely exemplary, illustrative and representative of the subject matter which is broadly contemplated by the present application. Reference to an element in the following Claims in the singular is not intended to mean nor shall it mean in interpreting such Claim element "one and only one" unless explicitly so stated, but rather "one or more". All structural and functional equivalents to any of the elements of the above-described embodiment(s) that are known or later come to be known to those of ordinary skill in the art are expressly incorporated herein by reference and are intended to be encompassed by the present Claims. Any term used in the Specification and/or in the Claims and expressly given a meaning in the Specification and/or Claims in the present Application shall have that meaning, regardless of any dictionary or other commonly used meaning for such a term. It is not intended or necessary for a device or method discussed in the Specification as an embodiment to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

We claim:

1. A device comprising:
   a laser source producing a continuous output on a beam path;
   an amplifier;
   a partially transmissive, partially reflective optic disposed on said beam path between said laser source and said amplifier; and
   a droplet generator positioned to deliver a droplet moving on a path intersecting said beam path, the droplet reflecting light to establish an optical cavity with said optic.

2. A device as recited in claim 1 wherein said laser source comprises a $CO_2$ laser having an output in the range of 0.1 W to 100 W.

3. A device as recited in claim 1 wherein said partially transmissive, partially reflective optic reflects between 75% and 99.9% of the laser source output.

4. A device as recited in claim 1 wherein said laser source has a power output, the partially transmissive, partially reflective optic has a reflectivity, and the power output and reflectivity are selected wherein the light entering the amplifier from the oscillator does not substantially deplete gain in the amplifier.

5. A device as recited in claim 1 further comprising an adjustable telescope disposed along said beam path between said oscillator and said amplifier.

6. A device as recited in claim 1 further comprising an optical isolator disposed between said laser source and said partially transmissive, partially reflective optic to protect said oscillator from reflected light.

7. A device as recited in claim 1 wherein the laser source produces a continuous output having at least two lines and the amplifier has a gain band including said two lines.

* * * * *